(12) United States Patent
Baek et al.

(10) Patent No.: US 11,183,413 B2
(45) Date of Patent: Nov. 23, 2021

(54) METHODS RELATED TO PREPARATION OF A STENCIL TO RECEIVE A PLURALITY OF IC UNITS

(71) Applicant: Rokko Systems Pte Ltd, Singapore (SG)

(72) Inventors: Seung Ho Baek, Singapore (SG); Deok Chun Jang, Singapore (SG); Jong Jae Jung, Singapore (SG)

(73) Assignee: Rokko Systems Pte Ltd, Singapore (SG)

( * ) Notice: Subject to any disclaimer, the term of this patent is extended or adjusted under 35 U.S.C. 154(b) by 0 days.

(21) Appl. No.: 15/355,061

(22) Filed: Nov. 18, 2016

(65) Prior Publication Data

US 2017/0162412 A1 Jun. 8, 2017

(30) Foreign Application Priority Data

Dec. 4, 2015 (SG) .............................. 10201509996U

(51) Int. Cl.
| | | |
|---|---|---|
| *H01L 21/683* | (2006.01) | |
| *H01L 23/00* | (2006.01) | |
| *H01L 21/673* | (2006.01) | |
| *H01L 21/66* | (2006.01) | |

(52) U.S. Cl.
CPC .... *H01L 21/6835* (2013.01); *H01L 21/67333* (2013.01); *H01L 22/12* (2013.01); *H01L 2221/68313* (2013.01); *H01L 2221/68354* (2013.01)

(58) Field of Classification Search
CPC ........... H01L 21/67336; H01L 21/6835; H01L 24/14; H01L 22/10; H01L 2221/68354; H01L 2224/1412; H01L 2221/68313; H01L 2221/68309; H01L 22/12; H01L 21/67333

See application file for complete search history.

(56) References Cited

U.S. PATENT DOCUMENTS

| | | | | |
|---|---|---|---|---|
| 10,192,785 | B2 * | 1/2019 | Liu | ......................... H01L 24/14 |
| 10,200,077 | B2 * | 2/2019 | Liu | ....................... H04B 1/0057 |
| 10,797,002 | B2 * | 10/2020 | Nguyen | ............... H01L 21/6835 |
| 10,907,247 | B2 * | 2/2021 | Lim | .................. H01L 21/67144 |
| 2002/0096253 | A1 * | 7/2002 | Shim, II | .................. H01L 21/56 156/297 |
| 2009/0242245 | A1 * | 10/2009 | Asano | ................. H01L 21/6835 174/255 |
| 2011/0278717 | A1 * | 11/2011 | Pagaila | ............... H01L 23/5389 257/737 |
| 2016/0111375 | A1 * | 4/2016 | Bair | ....................... H01L 23/552 438/110 |
| 2017/0117184 | A1 * | 4/2017 | Liu | ........................ H01L 23/552 |

\* cited by examiner

*Primary Examiner* — M. A. Golub-Miller

(57) ABSTRACT

A method for preparing a stencil to receive a plurality of IC units, the method comprising the steps of: providing a metal substrate having an array of apertures; applying an adhesive surface to said substrate; removing portions of said adhesive surface corresponding to the apertures in the metal substrate.

6 Claims, 11 Drawing Sheets

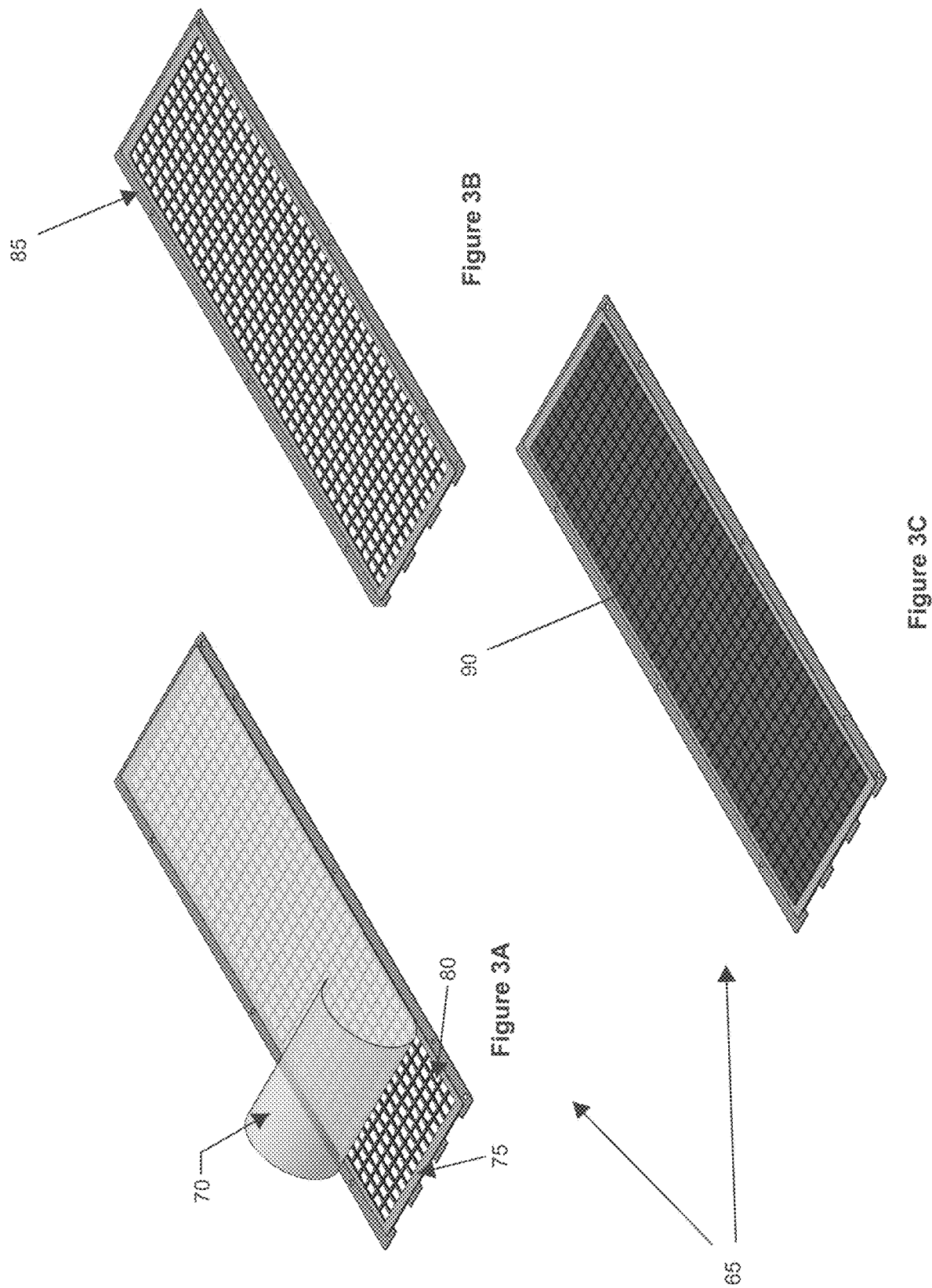

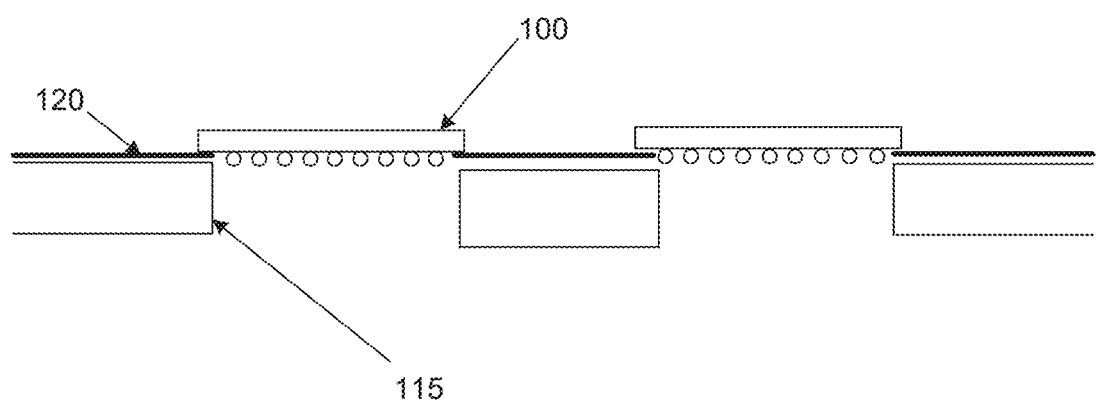
Figure 4B – Section B-B

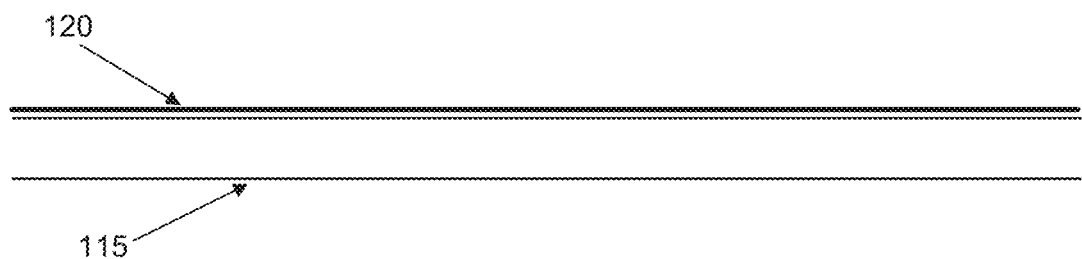
Figure 4D — Section C-C

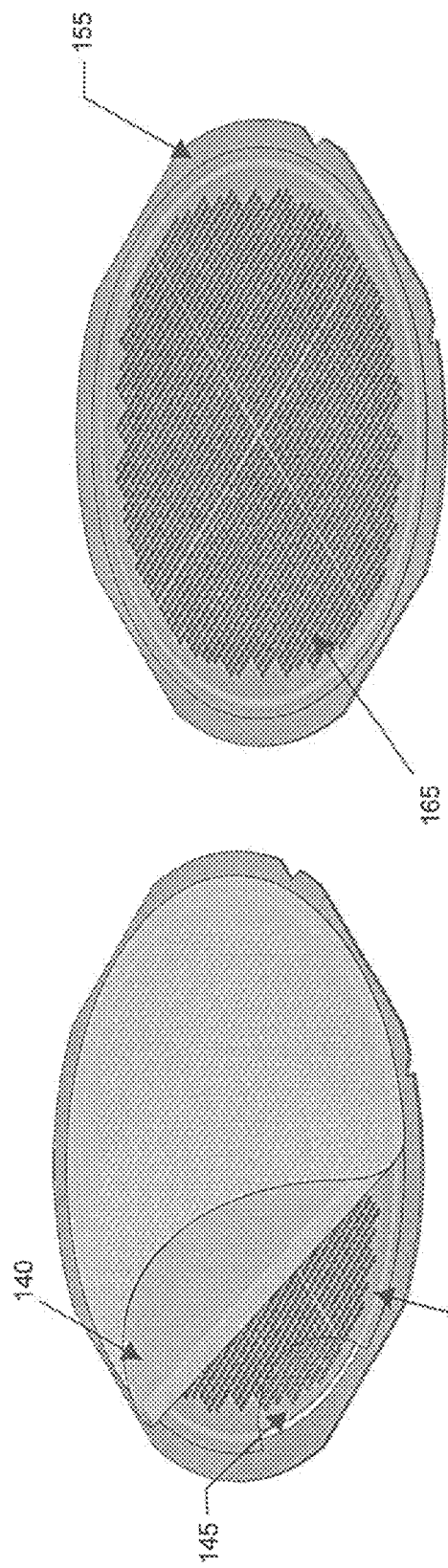
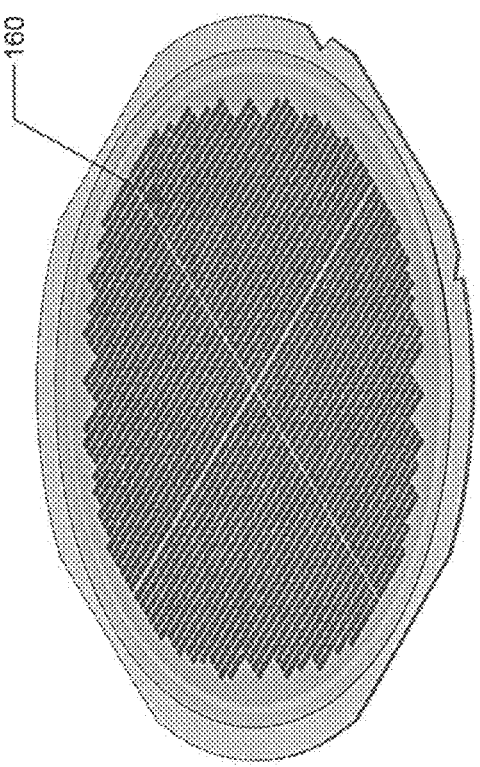
Figure 6A
Figure 6B
Figure 6C

METHODS RELATED TO PREPARATION OF A STENCIL TO RECEIVE A PLURALITY OF IC UNITS

CROSS-REFERENCE TO RELATED APPLICATIONS

This application claims priority to Singapore Application No. SG 10201509996U filed with the Intellectual Property Office of Singapore on Dec. 4, 2015 and entitled "IMPROVED SUBSTRATE PROCESSING AND APPARATUS," which is incorporated herein by reference in its entirety for all purposes.

FIELD OF THE INVENTION

The invention relates to the processing of integrated circuit (IC) units and in particular methods and apparatus to assist in the sputtering of ball grid array (BGA) IC units.

BACKGROUND

Sputtering to deposit thin films of materials on IC units is an efficient method of applying materials having very high melting points. Thus, sputtering has become widely used given its flexibility for the materials to be applied.

Typically an array of IC units are placed upon a substrate and passed through a sputtering chamber to receive the thin material layer.

Ball grid array (BGA) IC units are becoming more frequently used in place of standard flat IC units, which are limited in the interconnection pins by the perimeter length of the unit. A BGA chip can provide a higher density of interconnection pins on the face leading to better integration of devices on that chip. A problem lies, however, in using BGA chips in a sputtering chamber as the flat IC portion is separated from the substrate by the solder balls. Sputtering which is intended for the upper surface of the chip may defuse to the lower surface via the clearance provided by the solder balls lifting the chip from the substrate.

It would therefore be advantageous to avoid such diffusion whilst allowing BGA chips to be sputtered in the conventional method.

SUMMARY OF INVENTION

In a first aspect the invention provides a method for preparing a stencil to receive a plurality of IC units, the method comprising the steps of: providing a metal substrate having an array of apertures; applying an adhesive surface to said substrate; removing portions of said adhesive surface corresponding to the apertures in the metal substrate.

In a second aspect the invention provides a stencil for receiving a plurality of IC units, comprising: a metal substrate having an array of apertures; an adhesive surface on said substrate; said apertures arranged to receive said plurality of IC units.

In a third aspect the invention provides an ejector pin for an ejecting IC unit from an aperture, the ejector pin comprising: a shaft and a head at the end of said shaft, the head having a first contact surface larger than a cross section of the shaft; said first contact surface arranged to contact a surface of the IC unit and apply a force there to disengage the IC unit from the aperture.

In one aspect of the present invention, a stencil comprising a metal substrate having an array of apertures with the apertures being slightly smaller than the IC portion of the unit may be used. Accordingly, the unit fits on the aperture with the solder balls projecting through the aperture and thus removing the gap through which prior art arrangements allow diffusion of the sputter. By having the IC component of the unit flush with the stencil there is no gap through which the sputter can diffuse onto the opposed face of the unit.

In order to retain the unit on the stencil, without applying a vacuum, an adhesive surface may be provided on the stencil to "stick" the unit to the stencil, in place of a more conventional vacuum seal.

In a further embodiment the adhesive surface may be provided by a double sided tape applied to the stencil. In a further embodiment, to ensure the adhesive surface or the double sided tape corresponds to the aperture, the tape may be laser cut prior to the placement of the IC units. Alternatively, the adhesive surface may be sprayed or evaporated onto the metal substrate. The metal substrate may be placed on a surface as the adhesive is applied, with the excess adhesive removed by lifting the metal substrate from the surface.

In a still further embodiment the double sided tape may include a backing tape such that on laser cutting apertures in the tape, the backing tape may be peeled from the stencil and consequently removing the cut portion from the adhesive layer.

After the sputtering process, the units are removed from the adhesive layer. For conventional systems requiring a vacuum seal, this may be achieved through terminating the vacuum. In the present case where an adhesive layer is used, an ejector pin may be used. In a still further embodiment the ejector pin may be shaped so as to avoid contact with the electrode on the solder ball face of the unit. Alternatively, the ejector pin may be shaped to uniformly contact the internal portion of the unit including the electrode and thus having a step on the contact face of the ejector pin to contact both the solder ball surface and the electrode and thus apply a uniform pressure to the unit.

In a still further embodiment, in the case of the laser cut failing to cut the tape flush with the aperture in the stencil, this may lead to an overhang of the tape into the void of the aperture. In this case, the aperture may be sized such that the void in the tape aperture is sufficient to provide for the solder balls to project through and thus the unit being flush with the overhang portion of the tape rather than the aperture of the stencil.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

FIGS. 3A, 3B, and 3C are sequential isometric views of a substrate according to a process of the present invention.

FIG. 4B is a cross-sectional view taken along lines B-B of FIG. 4A, and FIG. 4D is a cross-sectional view taken along lines C-C of FIG. 4A.

FIGS. 6A, 6B, and 6C are sequential isometric views of a ring frame according to a further embodiment of the present invention.

DETAILED DESCRIPTION

Figure 1:
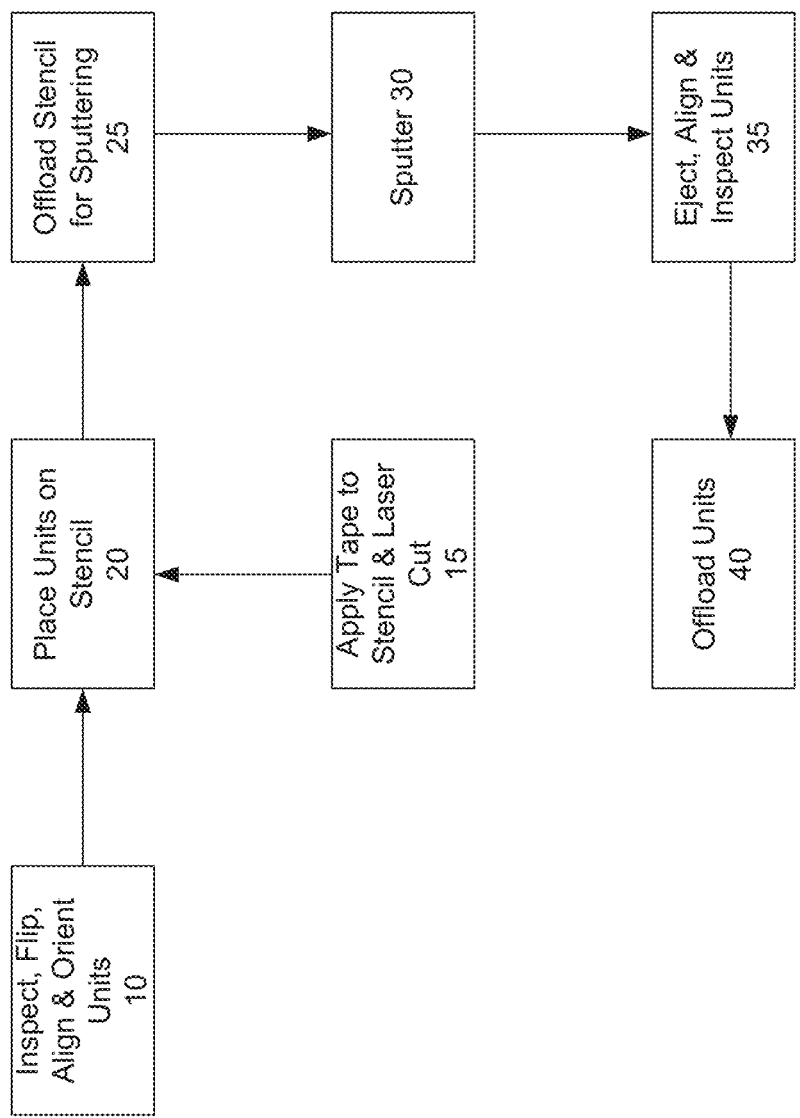
FIG. 1 is a flow chart according to one embodiment of the present invention.

FIG. 1 shows a flow chart of the overall process. It begins with the units being inspected, flipped, aligned and oriented 10. The units are then placed upon a stencil 20 to which a double sided tape has been applied and laser cut 15. Once the units are engaged with the stencil 20, the stencil is offloaded 25 and sent to sputtering 30. Following the sputtering process, the units are ejected, aligned and further inspected 35 before being offloaded 40.

The inspection, alignment and orientation step 10 includes conducting a top vision inspection then moving the units to a flipper and subsequently a picker for aligning the units. The units are then engaged by a picker to move the units to the stencil and inspecting the underside of the units during delivery by the picker.

Figure 2:
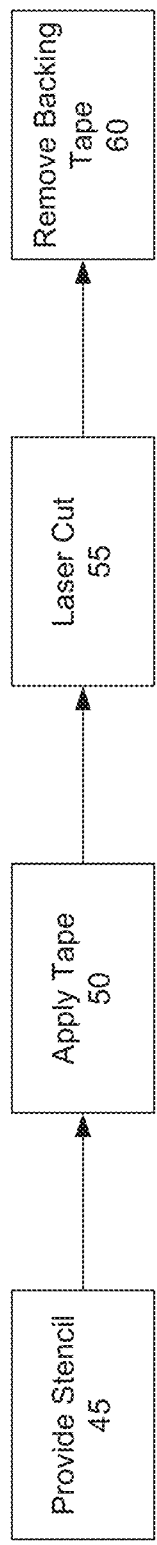
FIG. 2 is a flow chart according to a further embodiment of the present invention.

FIG. 2 shows the tape application and laser cut step 15 whereby a stencil is provided and a double sided tape applied thereto. The tape is then laser cut through the apertures of the stencil so as to cut the double sided tape. The backing tape of the double sided tape is then removed 60 removing the cut portions of the double sided tape and exposing an adhesive layer for receiving the units.

FIGS. 3A to 3C show the unit application process whereby the provided stencil 65 which in this case is a PCB sized stencil. The double sided tape 75 is applied to the stencil 65 and following the laser cut of the apertures 80, the backing tape 70 is peeled off. This leaves an adhesive layer 85 for receiving the units 90 into the respective apertures.

Figure 4A:
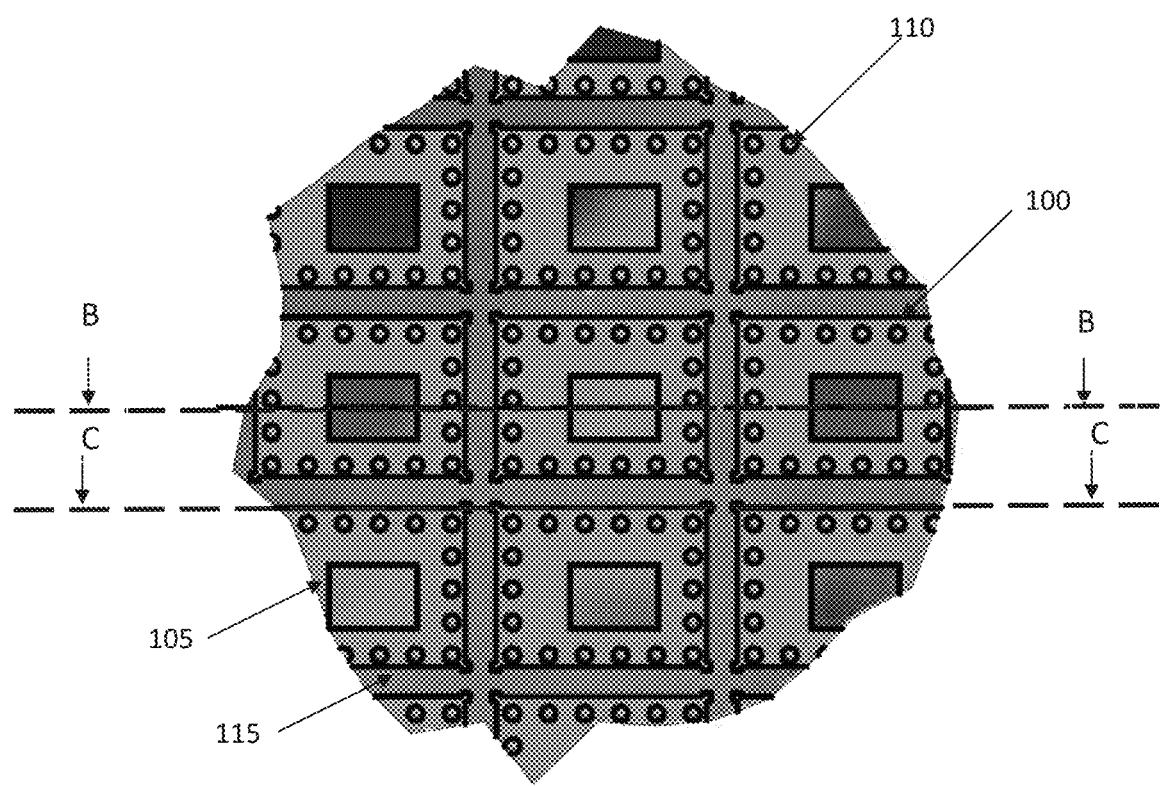
FIG. 4A is a bottom view of the stencil with IC units positioned above the apertures.
Figure 4C:
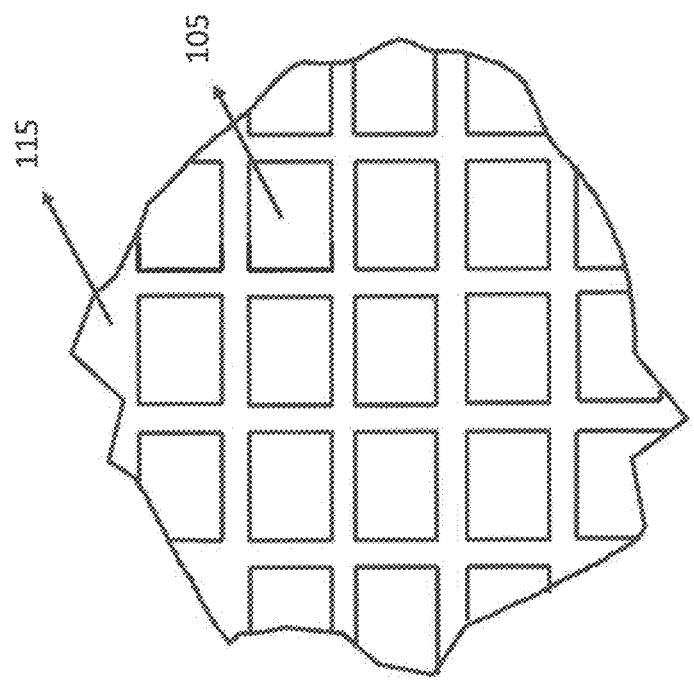
FIG. 4C is a top view of apertures with an array of apertures in it.

FIGS. 4A and 4B are detailed views of the units 100 placed on the stencil 115 and in particular, into the apertures 105 so as to allow the solder balls 110 to project through the aperture and thus the unit 100 sitting flushed with the tape 120.

Figure 5:
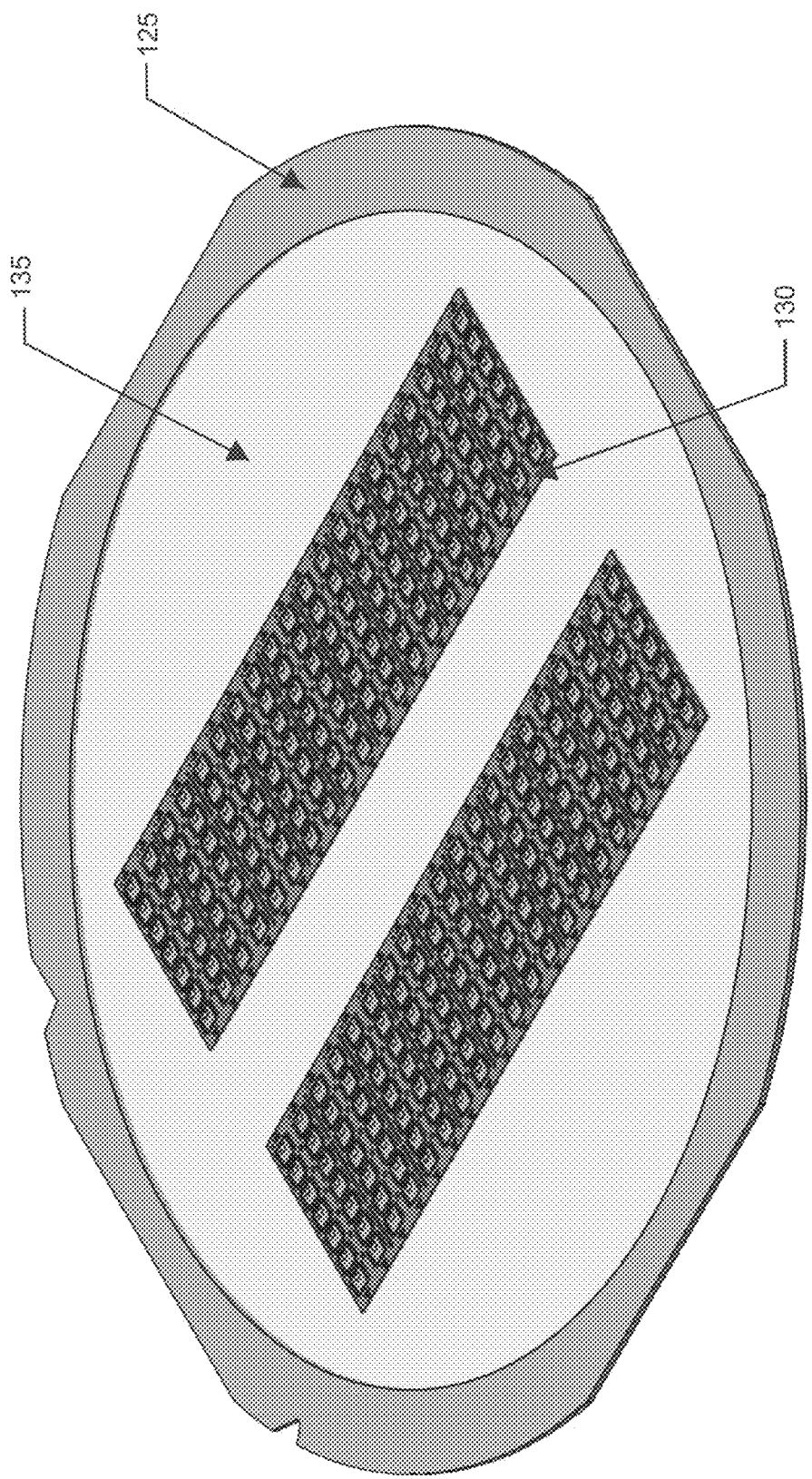
FIG. 5 is an isometric view of a ring frame according to one embodiment of the present invention.

In this particular embodiment using the PCB sized stencil, as shown in FIG. 5, the stencil 130 having the units engaged with the adhesive layer, are then placed on an adhesive layer 135 of a ring frame 125. In this arrangement the ring frame can then be offloaded for sputtering of a smaller batch of units on the PCB sized stencil 130.

FIGS. 6A to 6C show a conventional view where large volumes of units may be sputtered whereby the stencil 145 is entirely coated by the double sided tape 150. As with the PCB embodiment of FIGS. 3A to 3C, the tape 150 is laser cut with the cut portions removed on peeling the backing tape 140 leading to the ring frame 155 having an adhesive layer 165 for receiving the units 160. As with the embodiment of FIG. 5, the ring frame 155 having the units 160 engaged thereon, can then be offloaded for sputtering.

Figure 7B:
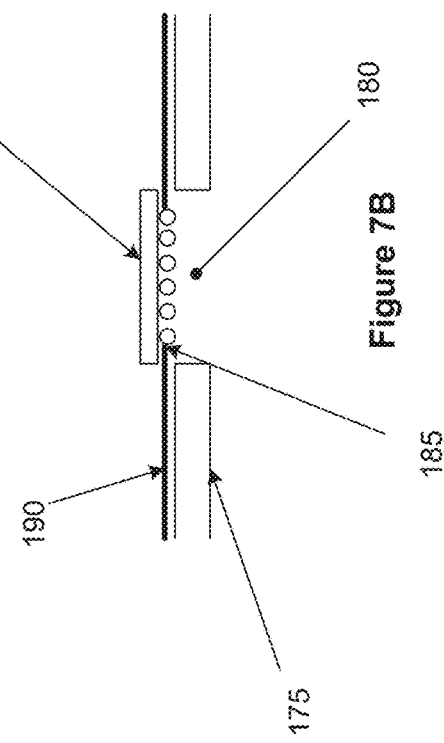
FIGS. 7A and 7B are various views of a recess in the stencil according to a further embodiment of the present invention.
Figure 7A:
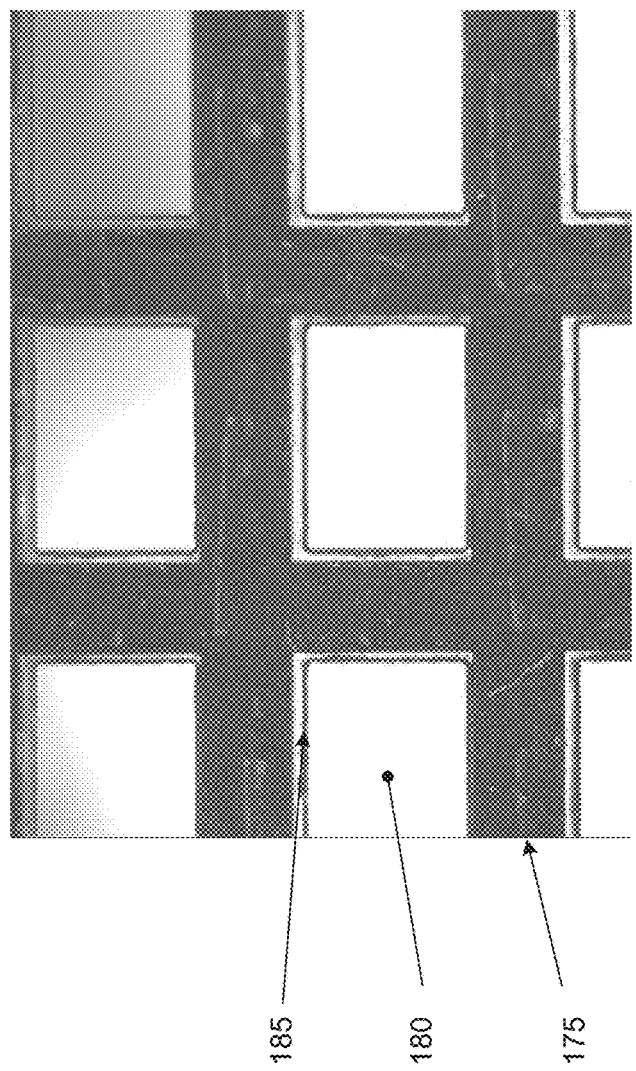

In a particular embodiment, the laser cutting of the double sided tape may not cut the tape flush with the stencil. FIGS. 7A and 7B show a particular example whereby the stencil 170 following the laser cut of the tape leaves an overhang 185 passed the stencil frame 175 leaving a reduced sized aperture 180. By accounting for this overhang 185, the stencil 170 may be sized to have apertures larger than normal whereby the aperture in the tape including the overhang 185 is sufficient to receive the unit 195 and sit on the overhang with the solder balls projecting into the aperture 180. Thus, the embodiment of FIGS. 7A and 7B fall within the scope of the present invention and accommodate practical limitations of the laser cutting practice.

Figure 8B:
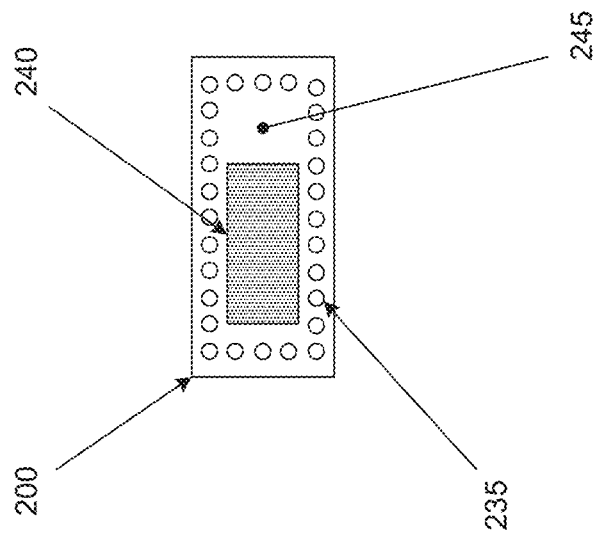
FIGS. 8A and 8B are various views of an ejector pin according to one embodiment of the present invention.
Figure 8A:
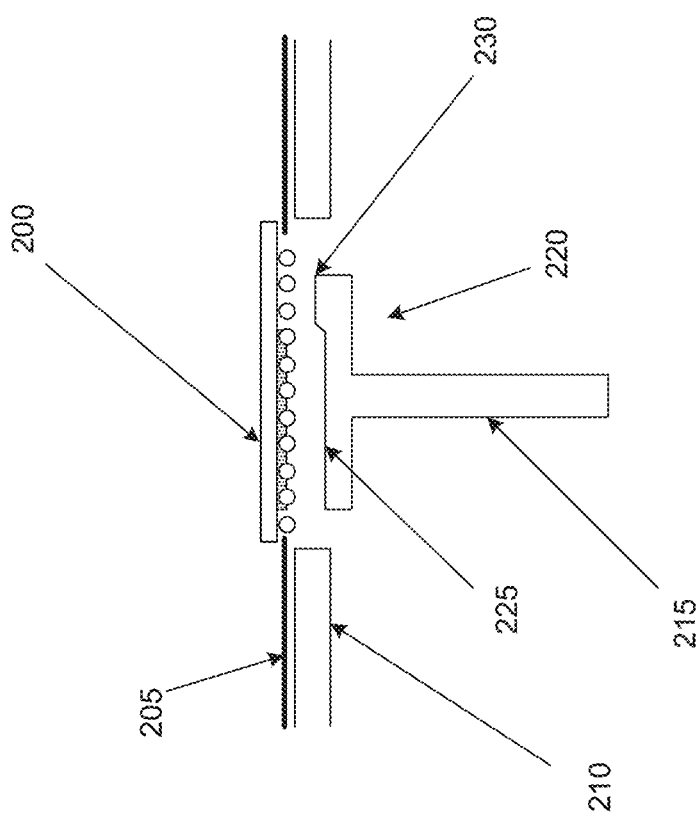

FIGS. 8A and 8B show the BGA chip 200 positioned on an adhesive surface 205 within a stencil 210. The BGA chip 200 includes solder ball connections 235 around the chip 200 with an electrode 240 within the array of solder balls and a vacant space, being a different area 245 adjacent to electrode 240.

To remove the BGA chip from the stencil requires an ejector pin, however, conventional ejector pins risk damaging the electrode 240 by applying a localized force which may scratch, damage or dislodge the electrode. To this end the present invention includes a new ejector pin 215 having a specialized head 220. The specialized head includes a first contact surface, larger than a cross sectional area of the shaft of the ejector in and a second surface. The first region 225 is arranged to contact the electrode so as to distribute the ejection force uniformly about the electrode. The second surface 230 is offset from the first portion 225 so as to contact the vacant area 245 of the BGA chip. Thus, the head 220 is arranged to apply a uniform pressure to the solder ball face of the BGA unit 200 and thus minimize the force applied to the electrode which may prevent damage.

Having described various systems and methods herein, some embodiments can include, but are not limited to:

In a first embodiment, a method for preparing a stencil to receive a plurality of IC units comprises the steps of: providing a metal substrate having an array of apertures; applying an adhesive surface to said substrate; and removing portions of said adhesive surface corresponding to the apertures in the metal substrate.

A second embodiment can include the method of the first embodiment, wherein the applying step includes placing a double sided tape to the substrate.

A third embodiment can include the method of the second embodiment, wherein the removing step includes laser cutting the double sided tape and then peeling a backing tape to expose the adhesive surface and remove the cut portions of the double sided tape.

A fourth embodiment can include the method of the first embodiment, wherein the applying step includes placing the metal substrate on a surface, applying a fluid adhesive to the substrate, and the removing step includes lifting the substrate from the surface to separate excess adhesive that has passed through the apertures.

In a fifth embodiment a method of processing IC units comprises comprising the steps of: preparing a stencil according to any one of the previously described methods; placing a plurality of the IC units in apertures of the stencil; and offloading the stencil.

A sixth embodiment can include the method of the fifth embodiment, further including the step, after the offloading step, of sputtering the IC units.

A seventh embodiment can include the method of the fifth or sixth embodiment, further including the steps of inspecting the IC units before the placing step.

An eighth embodiment can include the method of the sixth or seventh embodiment, further including the steps of inspecting the IC units after the sputtering step.

In a ninth embodiment, a stencil for receiving a plurality of IC units comprises: a metal substrate having an array of apertures; an adhesive surface on said substrate; and said apertures arranged to receive said plurality of IC units.

A tenth embodiment can include the stencil of the ninth embodiment, wherein the IC units are BGA chips, said apertures sized to allow solder ball connections of the BGA chips to pass through the aperture but retain the IC portion of the BGA chip.

An eleventh embodiment can include the stencil of the ninth or tenth embodiment, wherein the adhesive surface includes an opposed side of a double sided tape layer applied to the substrate.

In a twelfth embodiment, an ejector pin for an ejecting IC unit from an aperture comprises: a shaft and a head at the end of said shaft, the head having a first contact surface larger than a cross section of the shaft; and said first contact surface arranged to contact a surface of the IC unit and apply a force there to disengage the IC unit from the aperture.

A thirteenth embodiment can include the ejector pin of the twelfth embodiment, wherein the head includes a second contact surface offset from the first contact surface, said second contact surface arranged to simultaneous contact a different area on the IC unit.

A fourteenth embodiment can include the ejector pin of the thirteenth embodiment, wherein said ejector pin is arranged to eject a BGA chip, such that the first contact surface is arranged to contact an electrode on the BGA chip and the second surface is arranged to contact a different area on the BGA chip.

The invention claimed is:

1. A method of processing IC units, the method comprising the steps of:
   preparing a stencil by:
      providing the stencil comprising a metal substrate having an array of stencil apertures;
      applying an adhesive surface to a top surface of said stencil; and
      removing portions of said adhesive surface corresponding to the apertures in the stencil, to form adhesive apertures;
      wherein the adhesive surface is arranged to receive the IC units such that the IC units are positioned above the stencil apertures, so as to be selectively removable;
      wherein the adhesive apertures are smaller than the stencil apertures, defining an overhang of the adhesive layer;
      wherein the IC units comprise solder ball connections on the bottom of the units; and
      wherein the removing step includes laser cutting the adhesive surface, such that the adhesive apertures are larger in size than the solder ball connections;
   placing the IC units above apertures of the stencil such that the IC units are supported only by the overhang of the adhesive layer; and
   offloading the stencil.

2. The method according to claim 1, further including the step, after the offloading step, of sputtering the IC units.

3. The method according to claim 1, further including the steps of inspecting the IC units before the placing step.

4. The method according to claim 2, further including the steps of inspecting the IC units after the sputtering step.

5. The method according to claim 1 wherein the applying step includes placing a double sided tape to the substrate.

6. The method according to claim 5, wherein the removing step includes laser cutting the double sided tape and then peeling a backing tape to expose the adhesive surface and remove the cut portions of the double sided tape.

* * * * *